US012550344B2

(12) United States Patent
Cheng

(10) Patent No.: US 12,550,344 B2
(45) Date of Patent: Feb. 10, 2026

(54) SCHOTTKY DIODE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 554 days.

(21) Appl. No.: 18/073,828

(22) Filed: Dec. 2, 2022

(65) Prior Publication Data

US 2023/0099660 A1 Mar. 30, 2023

Related U.S. Application Data

(63) Continuation of application No. PCT/CN2020/132209, filed on Nov. 27, 2020.

(51) Int. Cl.
*H10D 8/60* (2025.01)
*H01L 21/324* (2006.01)
(Continued)

(52) U.S. Cl.
CPC .......... *H10D 8/60* (2025.01); *H01L 21/3245* (2013.01); *H01L 23/3171* (2013.01);
(Continued)

(58) Field of Classification Search
CPC .......... H10D 8/60; H10D 8/051; H10D 8/053; H10D 62/106; H10D 62/824;
(Continued)

(56) References Cited

U.S. PATENT DOCUMENTS

2006/0006413 A1* 1/2006 Beach .................. H01L 23/3171 257/192
2014/0252370 A1 9/2014 Kwak et al.
2019/0189808 A1* 6/2019 Mishima .............. H10H 20/825

FOREIGN PATENT DOCUMENTS

CN 103003948 A 3/2013
CN 104091835 A 10/2014
(Continued)

OTHER PUBLICATIONS

First Office Action issued in counterpart Chinese Patent Application No. 202080107495.1, dated Apr. 29, 2025.
(Continued)

*Primary Examiner* — Davienne N Monbleau
*Assistant Examiner* — Heim Kirin Grewal
(74) *Attorney, Agent, or Firm* — Westbridge IP LLC

(57) ABSTRACT

Disclosed are a Schottky diode and a manufacturing method thereof. The Schottky diode includes a substrate, a first semiconductor layer, a heterostructure layer, a passivation layer, and a cap layer stacked in sequence. The passivation layer includes a first groove and a second groove, and the first groove and the second groove penetrate through at least the passivation layer. A first electrode is arranged at least on the cap layer corresponding to the first groove; a second electrode is arranged in the second groove. A Schottky contact is formed between the first electrode and the cap layers, so that a direct contact area between the first electrode and the heterostructure layer may be avoided, a contradiction between the forward turn-on voltage and the reverse leakage of the Schottky diode may be balanced, and a leakage characteristic of the heterostructure layer in a high temperature environment may be suppressed.

15 Claims, 10 Drawing Sheets

(51) Int. Cl.
*H01L 23/31* (2006.01)
*H10D 8/01* (2025.01)
*H10D 62/10* (2025.01)
*H10D 62/824* (2025.01)
*H10D 62/85* (2025.01)
*H10D 62/854* (2025.01)

(52) U.S. Cl.
CPC ............. *H10D 8/051* (2025.01); *H10D 8/053* (2025.01); *H10D 62/106* (2025.01); *H10D 62/824* (2025.01); *H10D 62/8503* (2025.01); *H10D 62/854* (2025.01)

(58) Field of Classification Search
CPC .............. H10D 62/8503; H10D 62/854; H01L 21/3245; H01L 23/3171
See application file for complete search history.

(56) References Cited

FOREIGN PATENT DOCUMENTS

| | | | |
|---|---|---|---|
| CN | 104362181 | A | 2/2015 |
| CN | 104465795 | A | 3/2015 |
| CN | 107978642 | A | 5/2018 |
| CN | 211654831 | U | 10/2020 |
| WO | 2018148147 | A1 | 8/2018 |

OTHER PUBLICATIONS

International Search Report issued in corresponding PCT Application No. PCT/CN2020/132209, dated Jul. 30, 2021.

* cited by examiner

SCHOTTKY DIODE AND MANUFACTURING METHOD THEREOF

CROSS-REFERENCE TO RELATED APPLICATIONS

This application is a continuation of International Application No. PCT/CN2020/132209, filed on Nov. 27, 2020, the disclosure of which is hereby incorporated by reference in its entirety.

TECHNICAL FIELD

The present disclosure relates to the field of the semiconductor technology, and in particular, to a Schottky diode and a manufacturing method thereof.

BACKGROUND

Based on advantages of high switching frequency and low forward voltage drop, Schottky diodes are widely used. And the Schottky diode gradually replaces silicon in application of high-power semiconductor devices. However, there are obvious disadvantages with the improvement of the performance of traditional Schottky diodes. On the one hand, although low work function Schottky anode may reduce turn-on voltage, its reverse leakage current is relatively large; on the other hand, although an off-state leakage current may be reduced and a reverse withstand voltage may be increased by high work function anode, turn-on voltage and conduction losses are significantly increased. At present, an anode layer of a Schottky diode is directly formed on a heterostructure layer, which increases leakage characteristics of the heterostructure layer in a high temperature environment. Therefore, actual requirements may not be satisfied.

In view of the above drawbacks, there is an urgent need to provide a Schottky diode with a low-loss forward conduction and an effective reverse cut-off.

SUMMARY

The present disclosure provides a Schottky diode and a manufacturing method thereof to improve reverse leakage and reduce conduction loss.

According to a first aspect of the embodiments of the present disclosure, a Schottky diode is provided, including:

- a first semiconductor layer;
- a heterostructure layer located on the first semiconductor layer;
- a cap layer located on the heterostructure layer, the cap layer at least including a first area and a second area;
- a passivation layer located on the cap layer, the passivation layer including a first groove and a second groove, the first groove and the second groove at least penetrating through the passivation layer, and the first groove corresponding to the first area;
- a first electrode formed in correspondence to the first groove, the first electrode being in contact with the first area and/or the first electrode being in contact with the heterostructure layer; and
- a second electrode located in the second groove.

Optionally, the cap layer includes:

- an intrinsic semiconductor layer; or
- a P-type semiconductor layer, a doping element of the P-type semiconductor layer including magnesium; or
- a co-doped semiconductor layer, co-doped elements of the co-doped semiconductor layer including magnesium and one or more of silicon, germanium and oxygen.

Optionally, the Schottky diode further includes a second semiconductor layer, the second semiconductor layer is located in the first groove below the first electrode and above the first area, and the second semiconductor layer fails to fill up the first groove in a horizontal direction.

Optionally, the second semiconductor layer is a P-type semiconductor layer, a doping element includes magnesium, and a doping concentration of magnesium ranges from $1E16/cm^3$ to $5E20/cm^3$.

Optionally, a sidewall of the second semiconductor layer is not aligned with a sidewall of the first electrode.

Optionally, the cap layer is doped with a doping element, and a doping element content of the first area is higher than a doping element content of the second area.

Optionally, if the cap layer is the P-type semiconductor layer or the co-doped semiconductor layer, a doping concentration of the doping element of the cap layer is less than a doping concentration of the second semiconductor layer.

Optionally, the first area of the cap layer is an activated area.

Optionally, the first area includes a third groove, the third groove penetrates through the cap layer and exposes the heterostructure layer, and the third groove communicates with the first groove.

Optionally, the Schottky diode further includes a barrier layer arranged between the heterostructure layer and the cap layer.

Optionally, the Schottky diode further includes a dielectric layer, and the dielectric layer is located at least on the passivation layer and/or on a sidewall of the first groove.

Optionally, the heterostructure layer at least includes a channel layer and a potential barrier layer, and the channel layer and the barrier layer are stacked in sequence.

Optionally, the first semiconductor layer is a nucleation layer and/or a buffer layer.

Optionally, a material of the first semiconductor layer and a material of the second semiconductor layer are group III nitrides.

Optionally, the Schottky diode further includes a substrate, and the substrate is arranged below the first semiconductor layer.

According to a second aspect of the embodiments of the present disclosure, a manufacturing method of a Schottky diode is provided, including:

- forming a first semiconductor layer on a substrate;
- forming a heterostructure layer on the first semiconductor layer;
- forming a cap layer on the heterostructure layer, the cap layer including a first area and a second area;
- forming a passivation layer with a first groove and a second groove on the cap layer;
- performing annealing to activate the first area and obtaining an unactivated area of the cap layer not covered by the passivation layer;
- forming a first electrode in the first groove; and
- forming a second electrode in at least one of the second groove.

Optionally, after the performing annealing to activate the first area and obtaining an unactivated area of the cap layer not covered by the passivation layer, the manufacturing method of a Schottky diode while further includes:

- forming a second semiconductor layer in the first groove, the second semiconductor layer not filling up the first groove in the horizontal direction;

and the forming a first electrode in the first groove includes:

forming a first electrode in the first groove while covering the second semiconductor layer and the first area not covered by the second semiconductor layer.

Optionally, the performing annealing to activate the first area and obtaining an unactivated area of the cap layer not covered by the passivation layer includes:

performing annealing in nitrogen, nitric oxide, air, or a mixed gas of nitrogen and oxygen.

Technical solutions provided by the embodiments of the present disclosure may include the following beneficial effects.

It can be seen from an embodiment provided by the disclosure, a cap layer is arranged between electrodes and a heterostructure layer to form a Schottky contact between the electrodes and the cap layer, so that a direct contact between the electrode and the heterostructure layer may be avoided and a reverse leakage of a device may be reduced significantly. Furthermore, the cap layer is doped with a single element or co-doped with multiple elements, and the doping element located below the electrodes is activated so that a hole concentration of an activated area is high. Therefore, a forward turn-on voltage of the device may be reduced and performance of the device may be improved.

In another embodiment, a second semiconductor layer is arranged below electrodes, and the second semiconductor layer is a P-type semiconductor layer, so that a Schottky contact is formed between the first electrode and the second semiconductor layer, and reverse leakage may be balanced. Furthermore, when the cap layer has a third groove and the third groove penetrates through the cap layer and exposes the heterostructure layer, not only a Schottky contact may be formed between the first electrode and the second semiconductor layer, and meanwhile an ohmic contact may also be formed through a direct contact between the first electrode and the heterostructure layer. Through the foregoing structure, a direct contact area between the first electrode and the heterostructure layer may be reduced, and meanwhile reverse leakage caused by the ohmic contact may also be reduced. In this way, a contradiction between the forward turn-on voltage and the reverse leakage of the Schottky diode may be balanced, and a leakage characteristic of the heterostructure layer in a high temperature environment may be suppressed. By a mixed contact method of the first electrode, an off-state leakage current may be significantly reduced and a reverse withstand voltage may be increased without increasing the conduction loss.

In other embodiments, a barrier layer is provided, so that a groove may not penetrate through the barrier layer in the subsequent process of growing other epitaxial layers at high temperature as the barrier layer is not easily decomposed at high temperature. Therefore, a depth of the groove may not be lower than the barrier layer and an etching depth of the groove may be precisely controlled.

Understandably, foregoing general description and following detailed description are both exemplary and explanatory only and are not used to limit the present disclosure.

BRIEF DESCRIPTION OF THE DRAWINGS

Accompanying drawings described here are incorporated in the specification and constitute a part of the specification, and are used to illustrate embodiments consistent with the disclosure and explain principles of the disclosure in combination with the description.

FIG. 1(*b*) is a structural schematic diagram of a Schottky diode according to another embodiment.

FIG. 2(*b*) is a structural schematic diagram of a Schottky diode according to yet still another embodiment.

DETAILED DESCRIPTION OF THE EMBODIMENTS

Figure 1A:
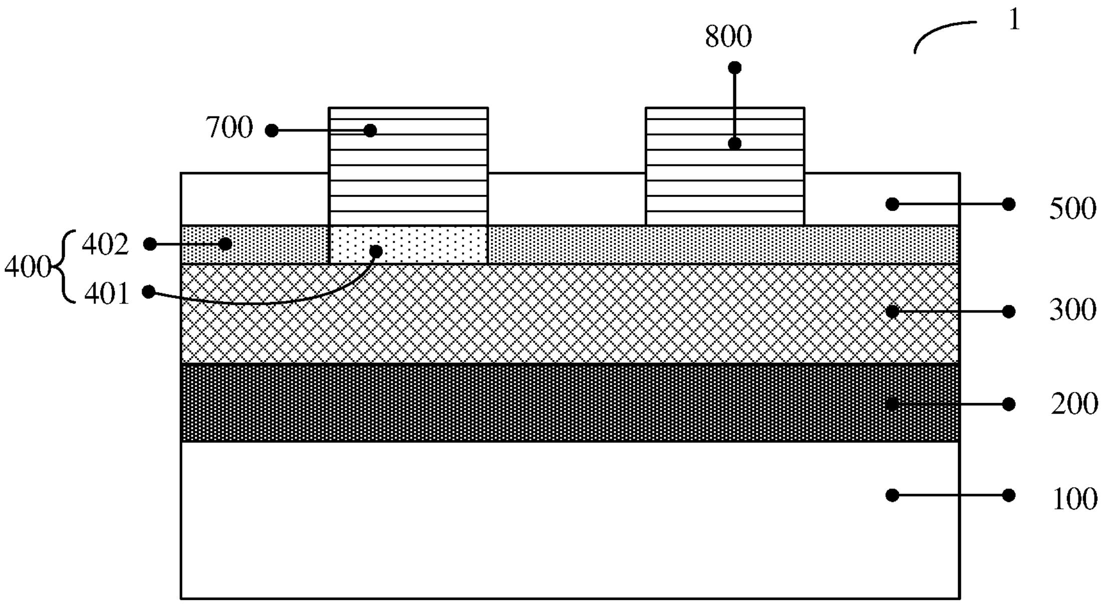
FIG. 1(*a*) is a structural schematic diagram of a Schottky diode according to an embodiment.

Exemplary embodiments will be described in detail herein, examples of which are illustrated in accompanying drawings. When the following description refers to the accompanying drawings, the same reference numerals in different accompanying drawings refer to the same or similar elements unless otherwise indicated. The implementations described in the exemplarily embodiments below are not intended to represent all implementations consistent with the present disclosure. Rather, they are merely examples of apparatus and methods consistent with some aspects of the present disclosure as recited in the appended claims.

Figure 1B:
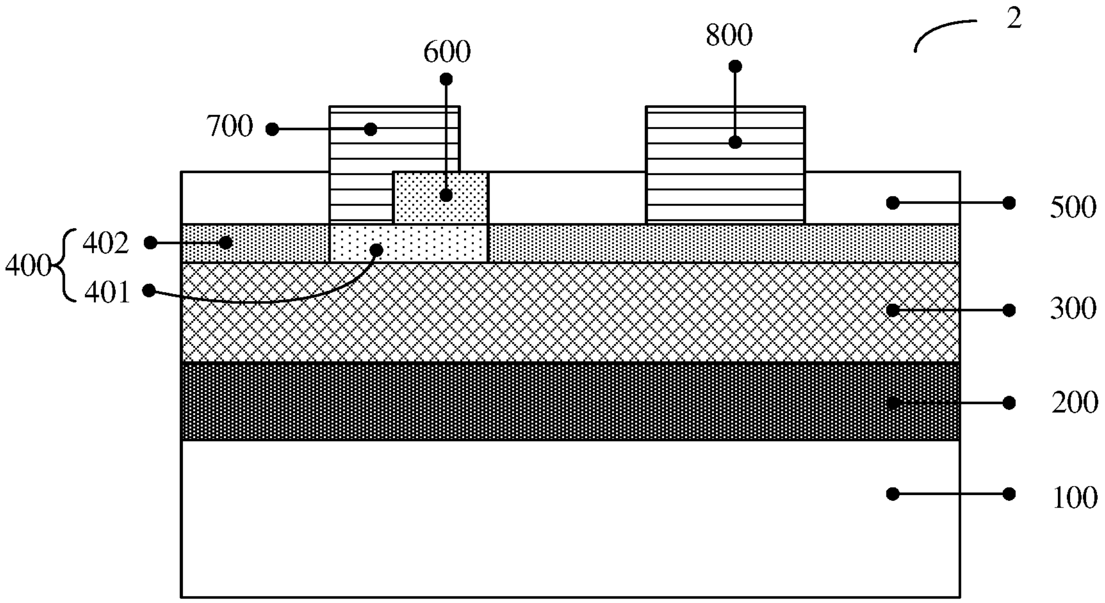

FIG. 1(*a*) is a structural schematic diagram of a Schottky diode according to an embodiment. As shown in FIG. 1(*a*), a Schottky diode 1 includes a substrate 100, a first semiconductor layer 200, a heterostructure layer 300, a cap layer 400, a passivation layer 500, a first electrode 700 and a second electrode 800. Therein, the first semiconductor layer 200 is formed on the substrate 100, and a material of the substrate 100 may include one or more of silicon, silicon carbide, gallium nitride, and sapphire. The first semiconductor layer 200 may be a nucleation layer and/or a buffer layer, and a material of the first semiconductor layer 200 may include one or more of AlN, GaN, AlGaN, and InN, which is not limited in the disclosure.

Furthermore, the heterostructure layer 300 is formed on the first semiconductor layer 200, the heterostructure layer 300 may include a multi-layer structure, and a material of the multi-layer structure is selected from group III nitrides. Optionally, the heterostructure layer 300 includes at least a channel layer and a potential barrier layer.

Furthermore, the cap layer 400 is formed on the heterostructure layer 300, and the cap layer 400 includes a first area 401 and a second area 402. A passivation layer 500 is formed on the cap layer 400. The passivation layer 500 may provide passivation and protection functions, reduce a surface state of the device, and effectively reduce current collapse. A material of the passivation layer 500 may include one or more of silicon nitride, silicon aluminum nitride and silicon dioxide. The passivation layer 500 may be formed on the cap layer 400 through a deposition process, including one or more of plasma enhanced chemical vapor deposition (PECVD), low pressure chemical vapor deposition (LPCVD), atomic layer deposition (ALD) and metal organic chemical vapor deposition (MOCVD).

In this embodiment, the cap layer 400 is an intrinsic semiconductor layer. For example, the cap layer 400 is an intrinsic III-nitrides semiconductor layer. Furthermore, there is no difference in material and function between the first area 401 and the second area 402 of the cap layer 400. Both the two areas are used for protecting the heterostructure layer 300 and preventing carrier scattering.

FIG. 7(*d*) is a structural schematic diagram of an intermediate structure of a manufacturing process of a Schottky diode. As shown in FIG. 7(*d*), the passivation layer 500 includes a first groove 10 and a second groove 20, and the first groove 10 is formed in correspondence to the first area 401. The first groove 10 and second groove 20 penetrate through the passivation layer 500 and expose the cap layer 400. A quantity of the first groove 10 and the second groove 20 is not limited, and there is at least one the first groove 10 and at least one the second groove 20 if a manufacturing condition permits. Optionally, the quantity of first groove 10 and the quantity of the second groove 20 of the Schottky diodel shown in FIG. 1(*a*) are both one.

According to FIG. 1(*a*) and FIG. 7(*d*), the Schottky diode 1 may further include a first electrode 700 and a second electrode 800, the first electrode 700 is located on the cap layer 400 at least corresponding to the first groove 10, and the second electrode 800 is formed on the second groove 20. It should be noted that since the first groove 10 exposes the cap layer 400, a Schottky contact is formed between the first electrode 700 and the cap layer 400 exposed by the first groove 10. Therein, a material of the first electrode 700 may be selected from metal with a high work function to realize Schottky metal, for example, Ni, Au or Pt may be used to form the Schottky contact.

It may be seen from the above embodiments that the Schottky contact is formed between the first electrode 700 and the cap layer 400, so that a direct contact between the first electrode 700 and the heterostructure layer 300 may be avoided. And a contradiction between the forward turn-on voltage and the reverse leakage of the Schottky diode 1 may be balanced, and a leakage characteristic of the heterostructure layer 300 in a high temperature environment may be suppressed.

According to an embodiment of the present disclosure, a manufacturing method and structure of this embodiment are basically the same as the embodiment described above. And there is only a difference that the cap layer 400 may also be a P-type semiconductor layer. Optionally, a doping element may include magnesium, and a doping concentration of magnesium may range from $1E16/cm^3$ to $5E20/cm^3$. It should be noted that if the cap layer 400 is the P-type semiconductor layer, a difference between the first area 401 and the second area 402 is that the first area 401 is an activated area, while the second area 402 is an unactivated area. Furthermore, the activated area is formed by performing an annealing process to the first area 401 of the cap layer 400. In a specific process step, the heterostructure layer 300, the cap layer 400 and the passivation layer 500 are stacked in layers; then the first groove 10 penetrating through the passivation layer 500 to the cap layer 400 is formed; and the structure with the first groove 10 formed is placed in a hydrogen-free atmosphere for annealing, for example, the structure may be annealed in nitrogen, nitric oxide, air or a mixture of nitrogen and oxygen. Since the cap layer 400 corresponding to the first groove 10 is not covered by the passivation layer 500, hydrogen atoms may overflow and other atoms may be activated to form the activated area at the first area 401. And the second area 402 covered by the passivation layer 500 may be kept in a semi-insulating state as there is no channel for hydrogen atoms at other areas of the cap layer 400 covered by the passivation layer 500 to overflow, so that an unactivated area of the second area 402 is formed.

In this embodiment, not only a contradiction between the forward turn-on voltage and the reverse leakage of the Schottky diode 1 may be balanced and a leakage characteristic of the heterostructure layer 300 in a high temperature environment may be suppressed, but also the first electrode 700 is in contact with the activated area of the first area 401 of the cap layer 400, where a carrier concentration of the activated area is high, which is beneficial to improve the device performance.

According to an embodiment of the present disclosure, a manufacturing method and structure of this embodiment are basically the same as those embodiments described above. And there is only a difference that the cap layer 400 may also be a co-doped semiconductor layer. Optionally, co-doping elements may include magnesium, silicon and/or germanium. It should be noted that, if the cap layer 400 is the co-doped semiconductor layer, a difference between the first area 401 and the second area 402 is that the first area 401 is an activated area and the second area 402 is an unactivated area.

Compared with the foregoing embodiment, as multiple elements are co-coped, a self-compensation effect of magnesium impurities is reduced by co-doping, a hole concentration is greatly increased, and the forward turn-on voltage is reduced.

FIG. 1(*b*) is a structural schematic diagram of a Schottky diode according to another embodiment, and FIG. 7(*e*) is a structural schematic diagram of an intermediate structure of a manufacturing process of a Schottky diode. According to FIG. 1(*b*) and FIG. 7(*e*), a manufacturing method and structure of this embodiment are basically the same as the embodiment shown in FIG. 1(*a*). And there is only a difference that the Schottky diode 2 further includes a second semiconductor layer 600, and the second semiconductor layer 600 is located in the first groove 10 below the first electrode 700 and above the first area 401. Meanwhile, the first groove 10 is not filled up in the horizontal direction by the second semiconductor layer 600, that is, a part of the cap layer 400 is exposed. A thickness of the second semiconductor layer 600 is not limited. Optionally, the thickness of the second semiconductor layer 600 may be smaller than a thickness of the passivation layer 500.

The second semiconductor layer 600 is a P-type semiconductor layer, and optionally, a P-type nitride layer, and a doping element includes magnesium. Therein, a doping concentration of magnesium may range from $1E16/cm^3$ to $5E20/cm^3$. A manufacturing method of the second semiconductor layer 600 is selective growth. Meanwhile, the P-type semiconductor layer is formed by performing doping to an intrinsic semiconductor layer, for example, the P-type semiconductor layer may be formed by doping magnesium through a doping method of ion implantation of magnesium. Optionally, the P-type semiconductor layer may be obtained by doping magnesium based on group III nitrides. Furthermore, the second semiconductor layer 600 may be activated through an annealing process. For example, during the annealing process which may be performed in nitrogen, nitric oxide, air, or a mixed gas of nitrogen and oxygen, hydrogen atoms in the second semiconductor layer 600 will overflow and magnesium atoms will be activated, so that the second semiconductor layer 600 is activated.

In this embodiment, the first electrode 700 is arranged on the cap layer 400 and above the second semiconductor layer 600 corresponding to the first groove 10; a second electrode 800 is formed in the second groove 20. Optionally, a sidewall of the second semiconductor layer 600 is not aligned with a sidewall of the first electrode 700, so that an electric field peak generated by the sidewall of the first electrode 700 may be weaken. It should be noted that since the first groove 10 exposes a part of the cap layer 400, a Schottky contact may be formed between the first electrode 700 and the cap layer 400 exposed by the first groove 10 and as well between the first electrode 700 and the second semiconductor layer 600. The second semiconductor layer 600 may further improve the breakdown voltage to a certain extent.

Figure 2A:
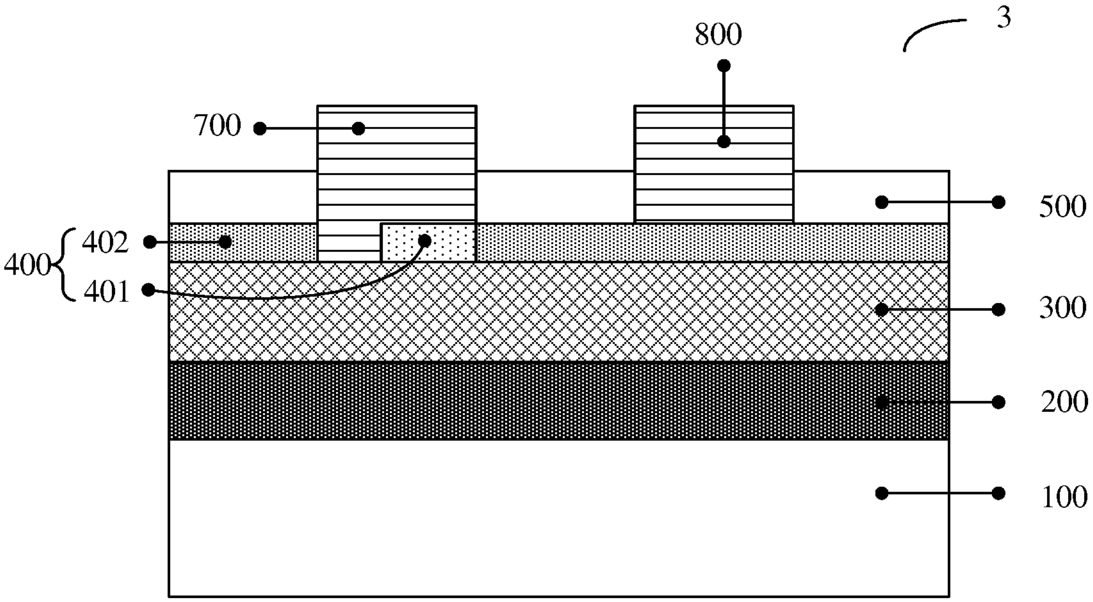
FIG. 2(*a*) is a structural schematic diagram of a Schottky diode according to still another embodiment.
Figure 2B:
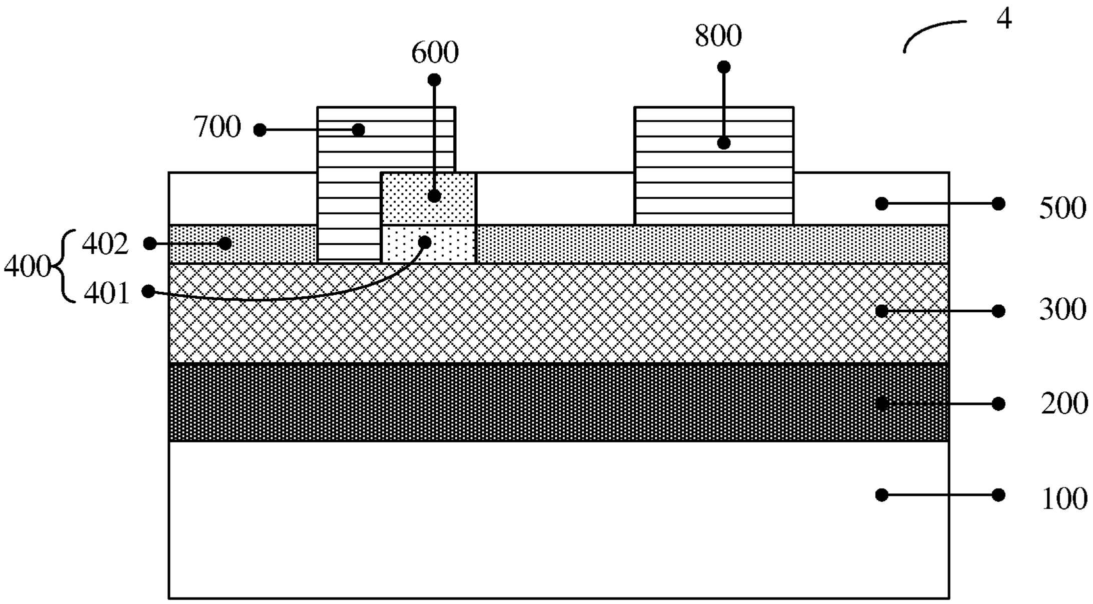

FIG. 2(*a*) is a structural schematic diagram of a Schottky diode according to still another embodiment. FIG. 7(*h*) is a structural schematic diagram of an intermediate structure of a manufacturing process of a Schottky diode. As shown in FIG. 2(*a*) and FIG. 7(*h*), compared with the Schottky diode 1 in FIG. 1, there is only a difference between the Schottky diode 3 and the Schottky diode 1 that the first area 401 of the cap layer 400 further includes a third groove 30. Optionally, the third groove 30 penetrates through the cap layer 400 and exposes the heterostructure layer 300, and the third groove 30 communicates with the first groove 10. The first electrode 700 is formed in the first groove 10 while covering the first area 401 and within the third groove 30, and the first electrode 700 is in contact with the heterostructure layer 300. In a specific process step, a pre-processing structure of the heterostructure layer 300 and the cap layer 400 may be formed by stacking in layers, and the pre-processing are etched with protection of a mask plate. Optionally, a selective etching method may be adopted to etch the first area 401 until the heterostructure layer 300 is exposed to form the third groove 30. A solution used in the selective etching method may include one or more of boric acid, phosphoric acid hydrofluoric acid, nitric acid and acetic acid.

In this embodiment, a Schottky contact may be formed between the first electrode 700 and the cap layer 400, so that a direct contact area between the first electrode 700 and the heterostructure layer 300 may be reduced. And with an ohmic contact formed between the first electrode 700 and the heterostructure layer 300, a mixed electrode contact mode made be formed, so that a contradiction between the forward turn-on voltage and the reverse leakage of the Schottky diode may be balanced, which is beneficial to improve the device performance.

FIG. 2(*b*) is a structural schematic diagram of a Schottky diode according to yet still another embodiment. FIG. 7(*i*) is a structural schematic diagram of an intermediate structure of a manufacturing process of a Schottky diode. According to FIG. 2(*b*) and FIG. 7(*i*), a manufacturing method and structure of this embodiment are basically the same as the embodiment shown in FIG. 2(*a*). And there is only a difference that the Schottky diode 4 further includes a second semiconductor layer 600 above the cap layer 400 within the third groove 30. The second semiconductor layer 600 corresponds to the first groove 10. Optionally, a doping concentration of a doping element of the cap layer 400 is lower than a doping concentration of a doping element in the second semiconductor layer 600. For example, a doping concentration of magnesium in the cap layer 400 is lower than $1E17/cm^3$, and a doping concentration of the second semiconductor layer 600 is higher than $1E17/cm^3$. A graded doping concentration is formed under the first electrode 700.

The doping concentration is gradually increased from the heterostructure layer 300 to the first electrode 700, which is beneficial to reduce interface transition energy between the first electrode 700 and the second semiconductor layer 600 and reduce break-over voltage. And meanwhile a low doping element concentration may be maintained in a contact area of the heterostructure layer 300, so that reverse breakdown may be controlled.

Figure 3:
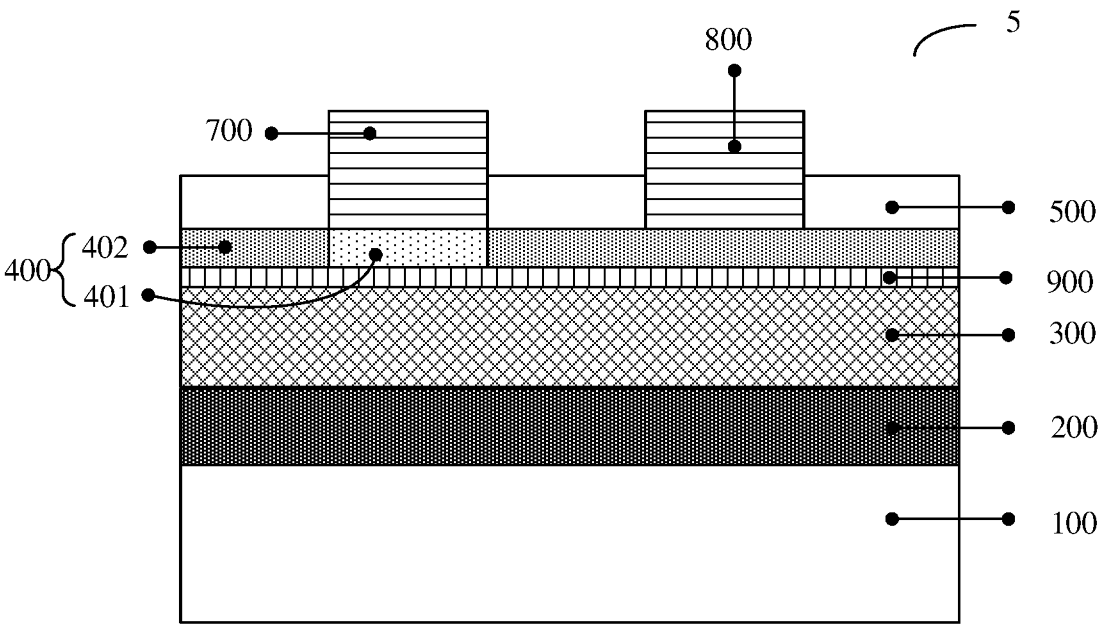
FIG. 3 is a structural schematic diagram of a Schottky diode according to yet still another embodiment.

FIG. 3 is a structural schematic diagram of a Schottky diode according to yet still another embodiment. As shown in FIG. 3, a manufacturing method and structure of this embodiment are basically the same as the embodiment shown in FIG. 1(*a*). And there is only a difference that the Schottky diode 5 further includes a barrier layer 900, and the barrier layer 900 is arranged between the heterostructure layer 300 and the cap layer 400.

The barrier layer 900 may be used to control and limit a depth of etching. Optionally, the barrier layer 900 may include an AlGaN layer. A depth of third groove 30 may be precisely controlled by arranging the barrier layer 900.

Figure 4:
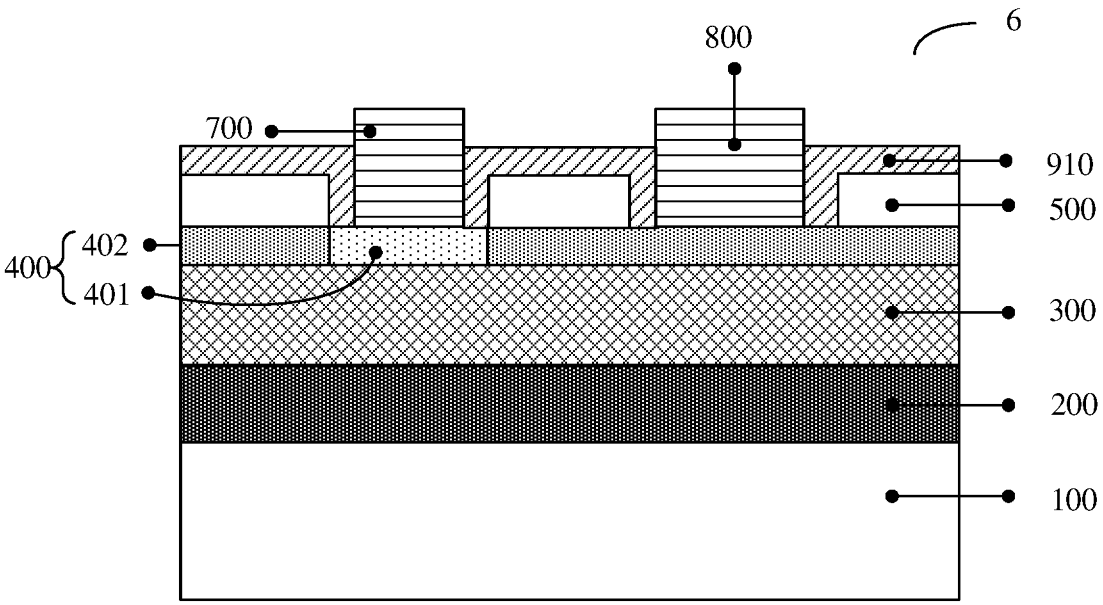
FIG. 4 is a structural schematic diagram of a Schottky diode according to yet still another embodiment.

FIG. 4 is a structural schematic diagram of the Schottky diode according to yet still another embodiment. As shown in FIG. 4, a manufacturing method and structure of this embodiment are basically the same as the embodiment shown in FIG. 1(*a*). And there is only a difference that the Schottky diode 6 further includes a dielectric layer 910. Optionally, the dielectric layer 910 is formed on the passivation layer 500 and sidewalls of the first groove 10 and the second groove 20. Through the arrangement of the dielectric layer 910, leakage of the device may be reduced and a voltage tolerance value of the Schottky diode 6 may be obtained. A material of the dielectric layer 910 may include one or more of aluminum nitride, silicon nitride, aluminum oxide, aluminum oxynitride, and silicon dioxide, which is not limited in this disclosure.

Figure 5:
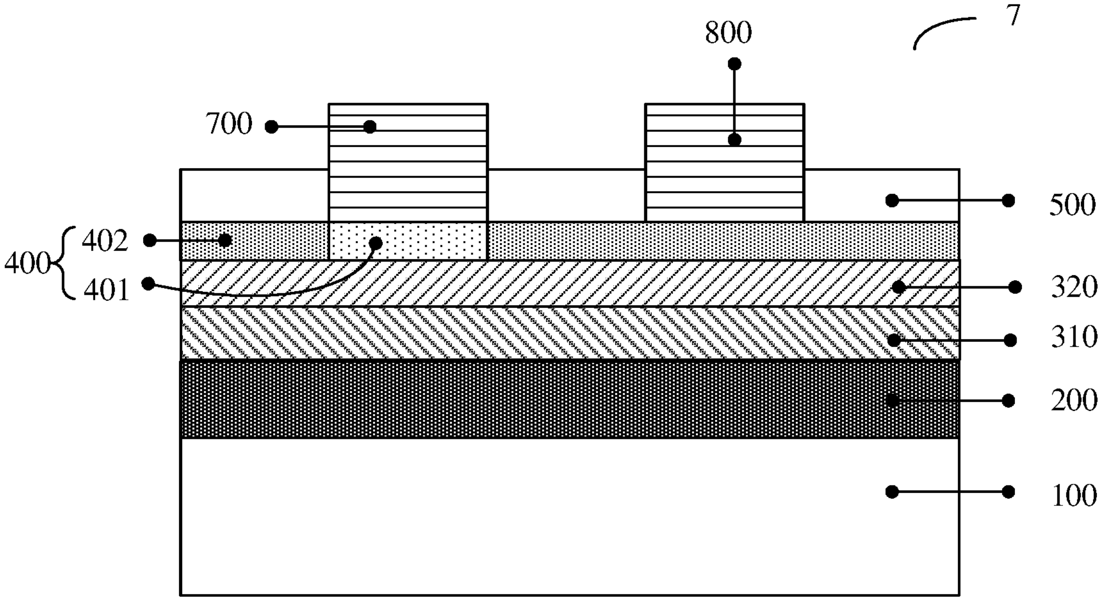
FIG. 5 is a structural schematic diagram of a Schottky diode according to yet still another embodiment.

FIG. 5 is a structural schematic diagram of the Schottky diode according to yet still another embodiment. As shown in FIG. 5, a manufacturing method and structure of this embodiment are basically the same as the embodiment shown in FIG. 1(*a*). And there is only a difference that the heterostructure layer 300 of the Schottky diode 7 includes a channel layer 310 and a potential barrier layer 320 stacked in sequence. The heterostructure layer 300 may be formed by stacking the channel layer 310 and the potential barrier layer 320 for only one time or by stacking an unit including the channel layer 310 and the potential barrier layer 320 for multiple times. Optionally, materials of the channel layer 310 and the potential barrier layer 320 are both group III nitrides. Therein, the potential barrier layer 320 is formed on the channel layer 310, a material of the channel layer 310 may include one or both of GaN and AlN, and a material of the potential barrier layer 320 may include one or more of AlN, GaN, AlInGaN, AlGaN, InGaN and InN, which is not limited in this disclosure. Based on that the channel layer 310 and the potential barrier layer 320 form a two-dimensional electron gas, a quantity of carriers may be increased by superimposing the channel layer 310 and the potential barrier layer 320 which are taken as an unit for multiple times, accordingly device efficiency may be improved.

Figure 6:
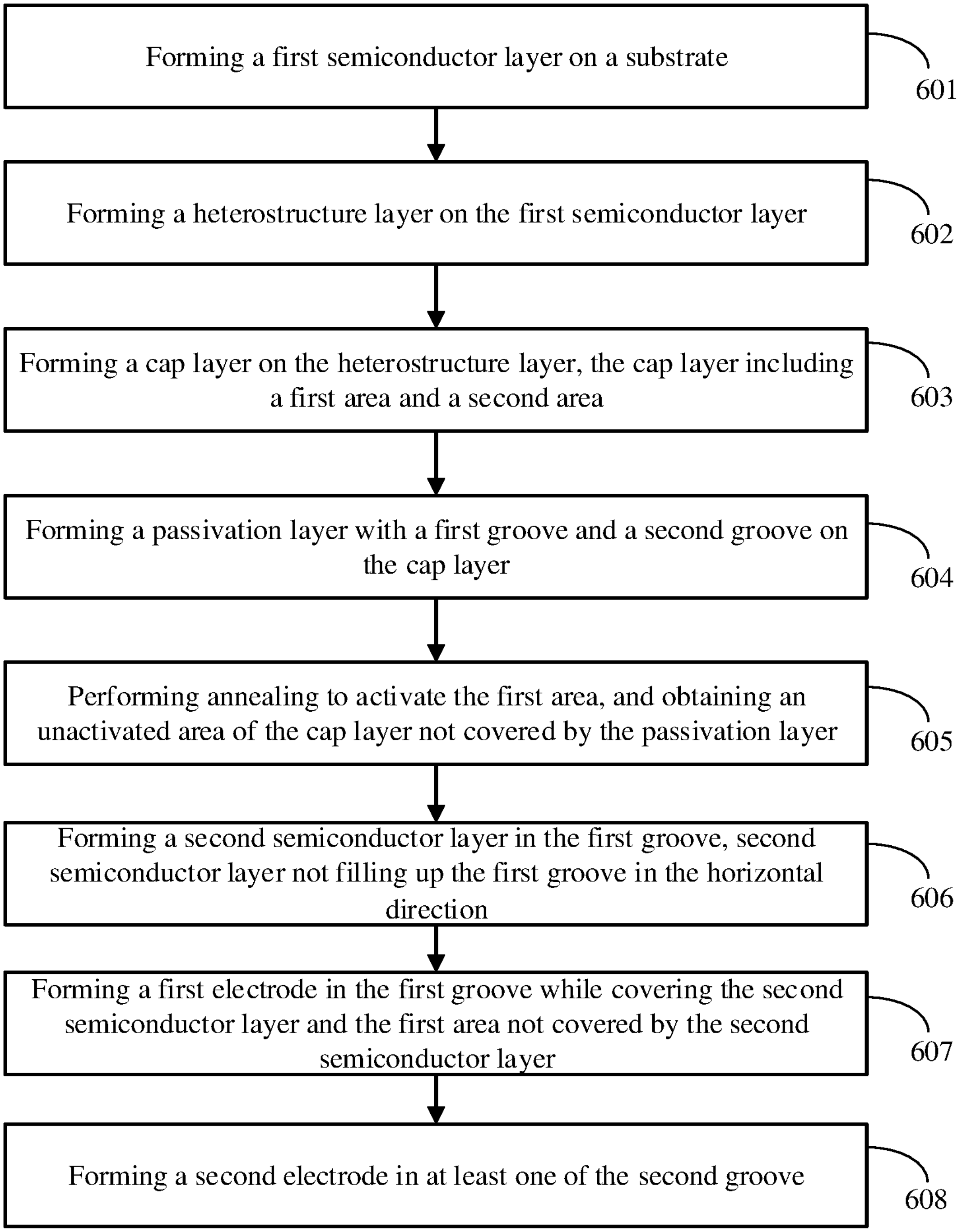
FIG. 6 is a flowchart of a manufacturing process of a Schottky diode according to an exemplary embodiment.
Figure 7A:
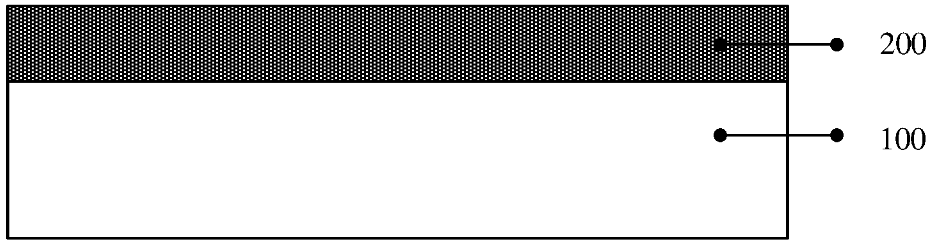
FIG. 7(*a*) to FIG. 7(*j*) are structural schematic diagrams of intermediate structures corresponding to the flowchart shown in FIG. 6.
Figure 7B:
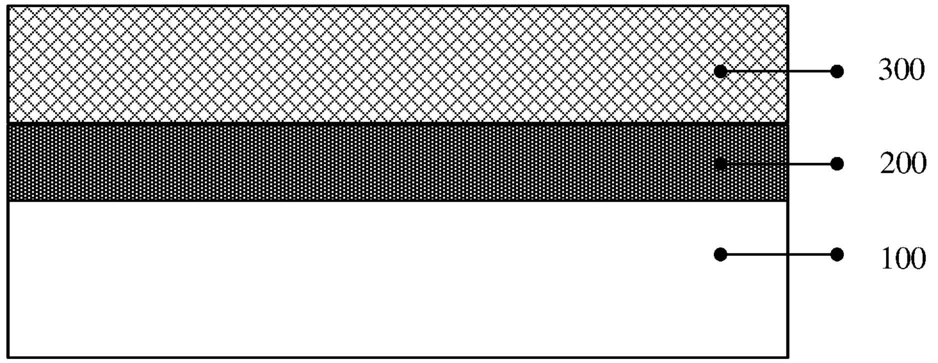
Figure 7C:
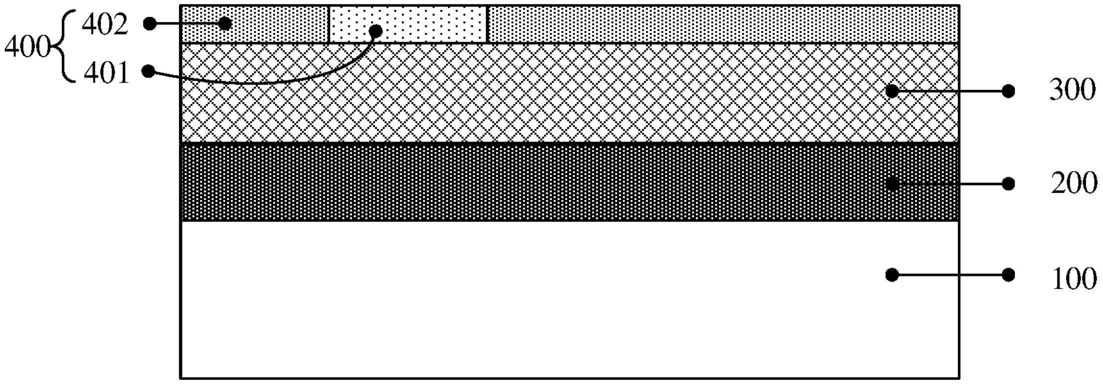
Figure 7D:
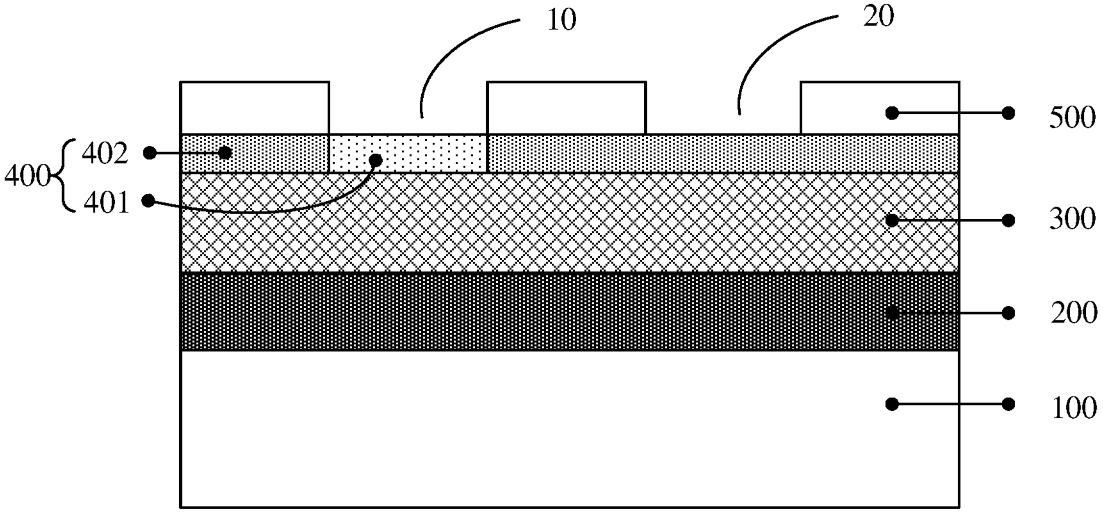
Figure 7E:
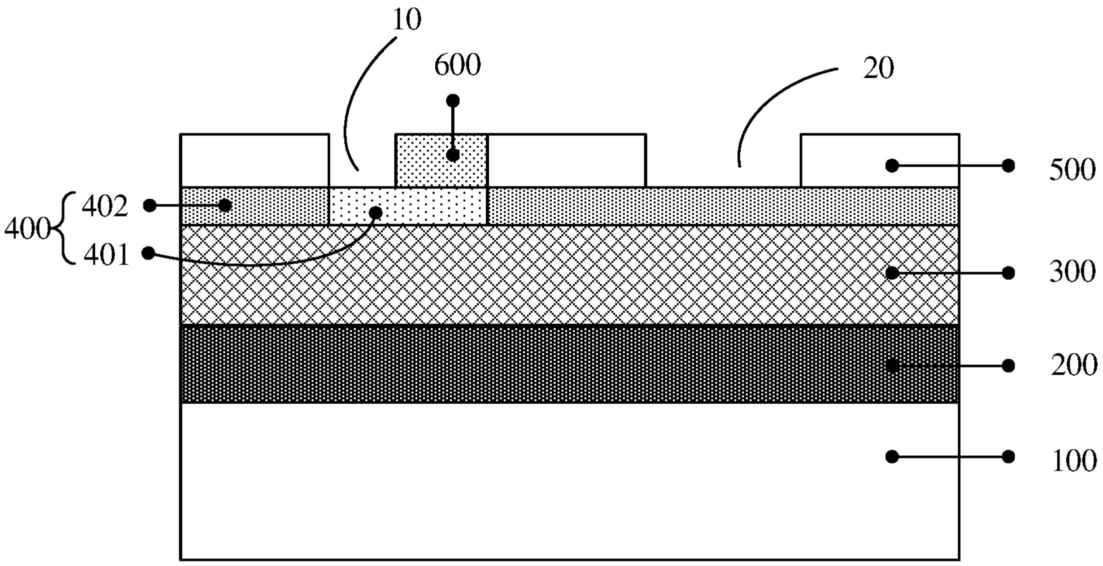
Figure 7F:
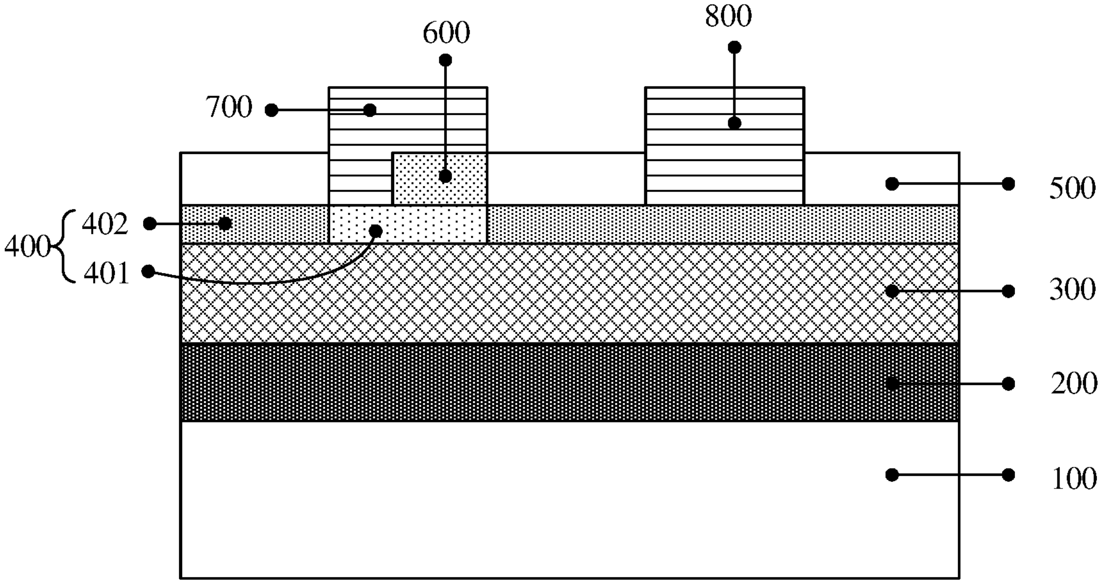
Figure 7G:
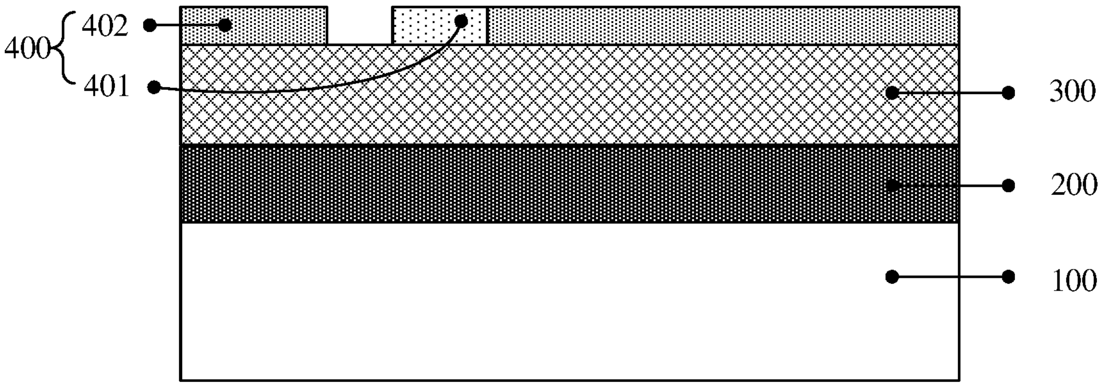
Figure 7H:
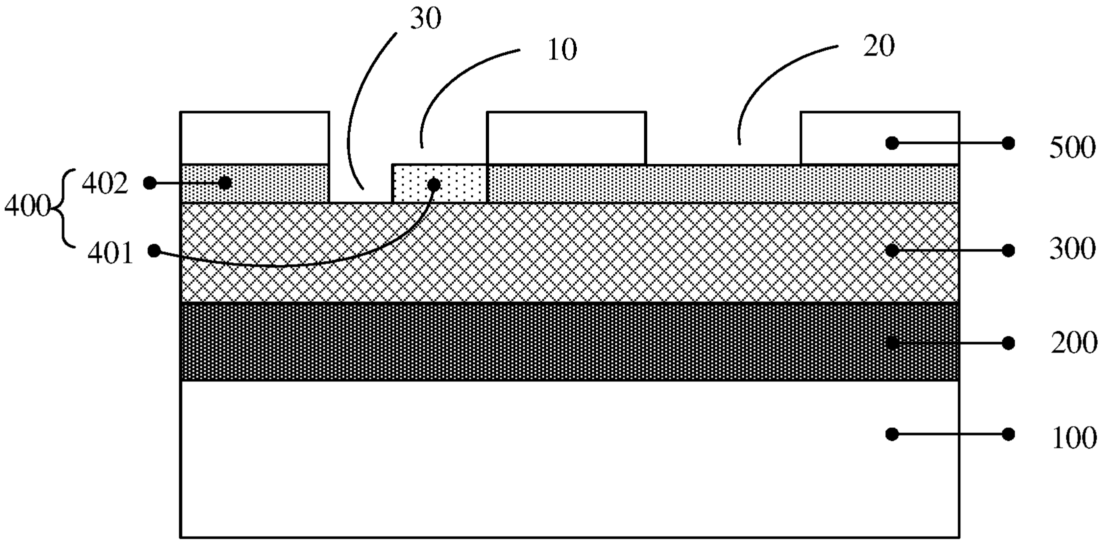
Figure 7I:
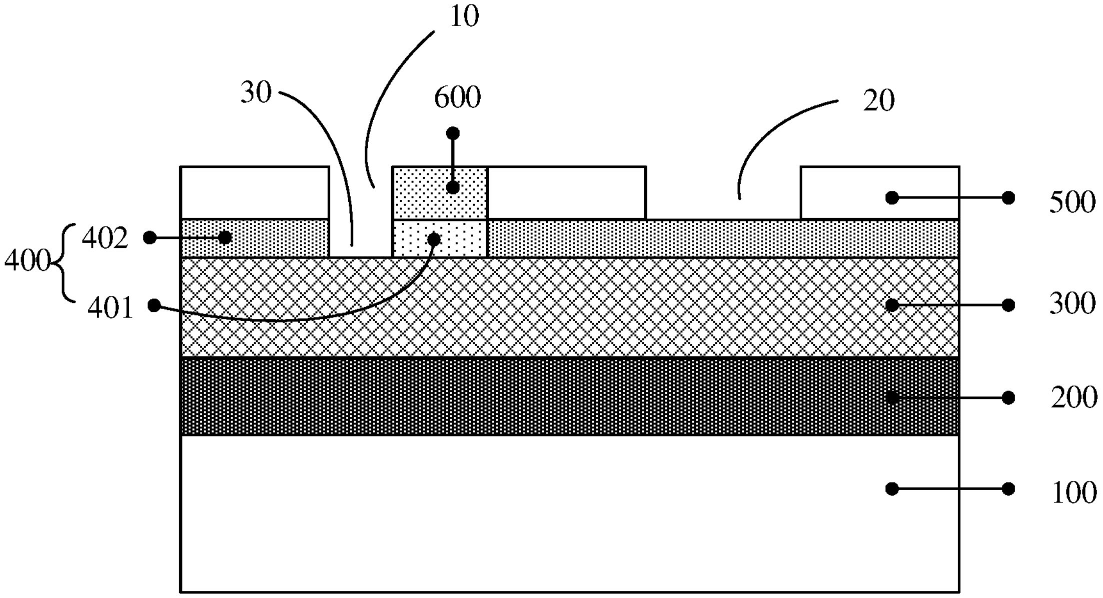
Figure 7J:
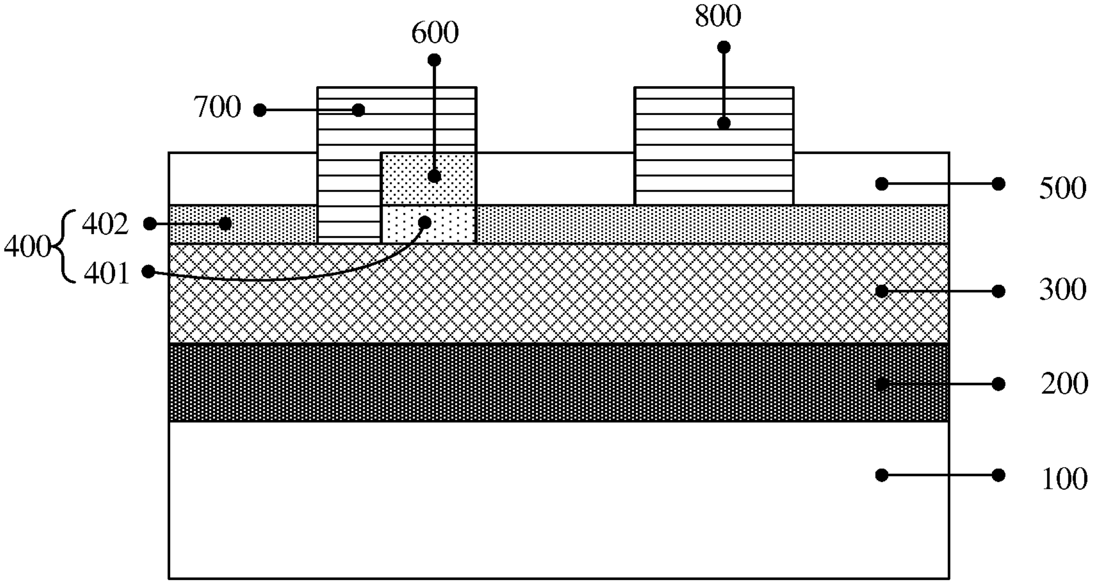

Based on the above technical solutions, a technological process corresponding to a manufacturing method of a Schottky diode is provided by the disclosure. FIG. 6 is a flowchart of a manufacturing process of a Schottky diode according to an exemplary embodiment, and FIG. 7(*a*) to FIG. 7(*g*) are structural schematic diagrams of intermediate structures corresponding to the flowchart shown in FIG. 6. The manufacturing method may include the following steps.

In step 601, as shown in FIG. 6 and FIG. 7(*a*), a first semiconductor layer 200 is formed on the substrate 100. The first semiconductor layer 200 is a nucleation layer and/or a buffer layer. Optionally, a material of the first semiconductor layer 200 is group III nitrides. For example, if the first semiconductor layer 200 is a nucleation layer, the material may include one or more of AlN, GaN, AlGaN, and InN.

In step 602, as shown in FIG. 6 and FIG. 7(*b*), a heterostructure layer 300 is formed on the first semiconductor layer 200.

In step 603, as shown in FIG. 6 and FIG. 7(*c*), a cap layer 400 is formed on the heterostructure layer 300, and the cap layer 400 includes a first area 401 and a second area 402.

In step 604, as shown in FIG. 6 and FIG. 7(*d*), a passivation layer 500 with a first groove 10 and a second groove 20 is formed on the cap layer 400. A material of the passivation layer 500 may include one or a combination of silicon nitride, silicon aluminum nitride, and silicon dioxide. In actual operation, the passivation layer 500 may be formed on the cap layer 400 by a deposition process using a mask, and the deposition process the passivation layer 500 may include one or more of PECVD, LPCVD, ALD and MOCVD.

In step 605, a structure with the first groove 10 formed is annealed to activate the first area 401, and area of the cap layer 400 covered by the passivation layer 500 forms an unactivated area. Furthermore, magnesium may be doped in the first area 401, and a doping concentration of magnesium may range from 1E16/$cm^3$ to 5E20/$cm^3$. And then the structure to be processed with the first groove 10 doped with magnesium is placed in a hydrogen-free atmosphere for annealing, for example, the structure may be annealed in nitrogen, nitric oxide, air or a mixture of nitrogen and oxygen. Since the cap layer 400 corresponding to the first groove 10 is not covered by the passivation layer 500, hydrogen atoms may overflow and other atoms may be activated to form the activated area at the first area 401. And the second area 402 covered by the passivation layer 500 may be kept in a semi-insulating state as there is no channel for hydrogen atoms at other areas of the cap layer 400 covered by the passivation layer 500 to overflow, so that an unactivated area of the second area 402 is formed.

In step 606, as shown in FIG. 6 and FIG. 7(*e*), a second semiconductor layer 600 is formed, the second semiconductor layer 600 is formed in the first groove 10, and the first groove 10 is not filled up by the second semiconductor layer 600 in the horizontal direction, and a thickness of the second semiconductor layer 600 is not limited. Optionally, the thickness of the second semiconductor layer 600 is smaller than a thickness of the passivation layer 500. A selective growth method of the second semiconductor layer 600 may be selected to reduce manufacturing cost and increase growth accuracy. The process of forming the second semiconductor layer 600 may further include forming an intrinsic semiconductor layer in the first groove 10 firstly, and then doping the intrinsic semiconductor layer by ion implantation. Optionally, a doping element is magnesium, and a doping concentration may range from 1E16/$cm^3$ to 5E20/$cm^3$. And the doped intrinsic semiconductor layer structure is annealed and activated to form the second semiconductor layer 600. The annealing should be performed in a hydrogen-free atmosphere, and specifically, for example, the annealing may be performed in nitrogen, nitrogen monoxide, air, or a mixed gas of nitrogen and oxygen.

Furthermore, in the process of ion implantation, a depth of ion implantation is not limited. Optionally, ion implantation may also be performed at the first area 401 below the second semiconductor layer 600, so a doping element concentration of the first area 401 is higher than that of the second area 402.

In step 607, as shown in FIG. 6 and FIG. 7(*f*), a first electrode 700 is formed, and the first electrode 700 is formed in the first groove 10 while covering the second semiconductor layer 600 and the first area 401 not covered by the second semiconductor layer 600, so that the first electrode 700 is in contact with the first area 401. A material of the first electrode 700 may be selected from metal with a high work function to realize Schottky metal, for example, Ni, Au or Pt may be used to form the Schottky contact.

In step 608, as shown in FIG. 6 and FIG. 7(*f*), a second electrode 800 is formed, and the second electrode 800 is arranged in the second groove 20.

In another embodiment, as shown in FIG. 7(*g*) to FIG. 7(*j*), the first area 401 of the cap layer 400 further includes a third groove 30. The third groove 30 penetrates through the cap layer 400 and exposes the heterostructure layer 300, and the third groove 30 communicates with the first groove 10. The first electrode 700 is formed in the first groove 10 while covering the second semiconductor layer 600 and other area of the first groove 10 not covered by the second semiconductor layer 600 within the third groove 30, and the first electrode 700 is in contact with the heterostructure layer 300. In this embodiment, a Schottky contact may be formed between the first electrode 700 and the cap layer 400, so that a direct contact area between the first electrode 700 and the heterostructure layer 300 may be reduced. Therefore, a contradiction between the forward turn-on voltage and the reverse leakage of the Schottky diode may be balanced, and a leakage characteristic of the heterostructure layer 300 in a high temperature environment may be suppressed. Furthermore, an ohmic contact is formed between the first electrode 700 and the heterostructure layer 300, which is beneficial to improve device performance.

It should be noted that: the disclosure does not limit a manufacturing sequence of the first electrode 700 and the second electrode 800.

Considering the description and the embodiments disclosed herein, those skilled in the art may easily come up with other embodiments of the disclosure. The disclosure is intended to cover any variations, application or adaptations of the present disclosure that follow the general principles of the disclosure, and to include common knowledge or conventional techniques in the technical field not disclosed in the disclosure. The specification and embodiments are to be regarded as exemplary only, with the true scope and spirit of the disclosure being indicated by the following claims.

Understandably, the present disclosure is not limited to the precise structures described above and illustrated in the accompanying drawings and that various modifications and changes may be made without departing from the scope thereof. The scope of the disclosure is limited only by the appended claims.

What is claimed is:

1. A Schottky diode, comprising:

a first semiconductor layer;

a heterostructure layer located on the first semiconductor layer;

a cap layer located on the heterostructure layer, the cap layer at least comprising a first area and a second area;

a passivation layer located on the cap layer, the passivation layer comprising a first groove and a second groove, the first groove and the second groove at least penetrating through the passivation layer, and the first groove corresponding to the first area;

a first electrode formed in correspondence to the first groove, the first electrode being in contact with the first area and/or the first electrode being in contact with the heterostructure layer; and a second electrode located in the second groove;

wherein the Schottky diode further comprises a second semiconductor layer, the second semiconductor layer is located in the first groove below the first electrode and above the first area, and the second semiconductor layer extends from a first sidewall and terminates before a second sidewall of the first groove in a horizontal direction.

2. The Schottky diode according to claim 1, wherein the cap layer is an intrinsic semiconductor layer; or the cap layer is a P-type semiconductor layer, and a doping element of the P-type semiconductor layer comprises magnesium; or the cap layer is a co-doped semiconductor layer, and co-doped elements of the co-doped semiconductor layer comprise magnesium and one or more of silicon, germanium and oxygen.

3. The Schottky diode according to claim 2, wherein if the cap layer is the P-type semiconductor layer or the co-doped semiconductor layer, a doping concentration of the doping element of the cap layer is less than a doping concentration of the second semiconductor layer.

4. The Schottky diode according to claim 1, wherein the second semiconductor layer is a P-type semiconductor layer, a doping element comprises magnesium, and a doping concentration of magnesium ranges from 1E16/$cm^3$ to 5E20/$cm^3$.

5. The Schottky diode according to claim 4, wherein if the cap layer is the P-type semiconductor layer or the co-doped semiconductor layer, a doping concentration of the doping element of the cap layer is less than a doping concentration of the second semiconductor layer.

6. The Schottky diode according to claim 1, wherein a sidewall of the second semiconductor layer is not aligned with a sidewall of the first electrode.

7. The Schottky diode according to claim 1, wherein a material of the first semiconductor layer and a material of the second semiconductor layer are group III nitrides.

8. The Schottky diode according to claim 1, wherein the cap layer is doped with a doping element, and a doping element content of the first area is higher than a doping element content of the second area.

9. The Schottky diode according to claim 1, wherein the first area of the cap layer is an activated area.

10. The Schottky diode according to claim 1, wherein the first area comprises a third groove, the third groove penetrates through the cap layer and exposes the heterostructure layer, and the third groove communicates with the first groove.

11. The Schottky diode according to claim 1, further comprising a barrier layer arranged between the heterostructure layer and the cap layer.

12. The Schottky diode according to claim 1, further comprising a dielectric layer, wherein the dielectric layer is located at least on the passivation layer and/or on a sidewall of the first groove.

13. The Schottky diode according to claim 1, wherein the heterostructure layer at least comprises a channel layer and a potential barrier layer, and the channel layer and the barrier layer are stacked in sequence.

14. The Schottky diode according to claim 1, wherein the first semiconductor layer is a nucleation layer and/or a buffer layer.

15. The Schottky diode according to claim 1, further comprising a substrate, wherein the substrate is arranged below the first semiconductor layer.

* * * * *